United States Patent
Lee et al.

(10) Patent No.: US 10,509,937 B2
(45) Date of Patent: Dec. 17, 2019

(54) CURVED-SURFACE ORGANIC LIGHT EMITTING DIODE DISPLAY DEVICE WITH FINGERPRINT IDENTIFICATION

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW); Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 60 days.

(21) Appl. No.: 15/699,486

(22) Filed: Sep. 8, 2017

(65) Prior Publication Data

US 2019/0080131 A1   Mar. 14, 2019

(51) Int. Cl.
 *G06K 9/00* (2006.01)
 *G06F 3/044* (2006.01)
 *G06F 3/041* (2006.01)
 *H01L 27/32* (2006.01)

(52) U.S. Cl.
 CPC ............ *G06K 9/0002* (2013.01); *G06F 3/044* (2013.01); *G06F 3/0412* (2013.01); *G06F 2203/04102* (2013.01); *G06F 2203/04105* (2013.01); *G06F 2203/04112* (2013.01); *H01L 27/323* (2013.01)

(58) Field of Classification Search
 CPC ....... G01L 1/142; G06F 3/0412; G06F 3/044; G06K 9/0002; G09G 2380/02; H03K 17/975; H03K 2217/960755
 See application file for complete search history.

(56) References Cited

U.S. PATENT DOCUMENTS

| | | | | |
|---|---|---|---|---|
| 2008/0093687 A1* | 4/2008 | Antaki | ................. | G06K 9/0002 257/415 |
| 2015/0048346 A1* | 2/2015 | Lee | ........................ | H01L 27/323 257/40 |
| 2016/0033342 A1* | 2/2016 | Lyon | ........................ | G01L 1/142 73/862.626 |
| 2016/0041663 A1* | 2/2016 | Chen | ..................... | G06F 3/0412 345/174 |
| 2018/0355175 A1* | 12/2018 | Han | .......................... | C08J 5/18 |

FOREIGN PATENT DOCUMENTS

| | | |
|---|---|---|
| CN | 104679341 A | 6/2015 |
| TW | 201710950 A | 3/2017 |

* cited by examiner

*Primary Examiner* — Kim Y Vu
*Assistant Examiner* — Michael J Vanchy, Jr.
(74) *Attorney, Agent, or Firm* — Muncy, Geissler, Olds & Lowe, P.C.

(57) ABSTRACT

A curved-surface OLED display device with fingerprint identification includes a substrate, a thin film transistor layer, a pixel electrode layer, an OLED display material layer, a common electrode layer, an encapsulation layer, a curved touch detection and fingerprint detection layer and a curved protective layer. The thin film transistor layer includes plural thin film transistors, plural scan lines, and plural data lines. The pixel electrode layer includes plural pixel electrodes. The curved touch detection and fingerprint detection layer includes plural sense electrodes and plural traces for performing the touch detection operation and fingerprint identification operation. A partial area of the curved touch detection and fingerprint detection layer and the curved protective layer exhibits a curved-surface shape.

11 Claims, 15 Drawing Sheets

CURVED-SURFACE ORGANIC LIGHT EMITTING DIODE DISPLAY DEVICE WITH FINGERPRINT IDENTIFICATION

BACKGROUND OF THE INVENTION

1. Field of the Invention

The present invention relates to the technical field of touch display panels and, more particularly, to a curved-surface organic light emitting diode display device with fingerprint identification.

2. Description of Related Art

Among many types of flat panel displays, the organic light emitting diode (OLED) display technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD.

Mobile communication has become an everyday commodity. The rise of smart mobile devices drives the development trend of touch display panel. In the application of wearable mobile devices, the organic light emitting diode (OLED) display has excellent features of thinness, light weight, self-illumination, low driving voltage, high efficiency, high contrast, high color saturation, fast response, flexibility, wide viewing angle, power saving, and so on. E-commerce and the rapid development of remote payments have led to the integration of biometrics identification technology and mobile devices. In particular, how to integrate the 3D touch sense and fingerprint identification into the OLED display with a small form factor is a challenge in the industry.

Therefore, it is desirable to provide a curved-surface organic light emitting diode display device with fingerprint identification to mitigate and/or obviate the aforementioned problems.

SUMMARY OF THE INVENTION

The object of the present invention is to provide a curved-surface organic light emitting diode display device with fingerprint identification in which the corresponding transistors are thin film transistors and integrated in a curved touch detection and fingerprint detection layer, such that the touch elements and fingerprint detection elements can be embedded and integrated into the display device. Therefore, the size of the curved-surface OLED display device can be dramatically reduced and the manufacturing process can be simplified.

To achieve the object, there is provided a curved-surface organic light emitting diode display device with fingerprint identification, which includes a substrate, a thin film transistor layer, a pixel electrode layer, an organic display material layer, a common electrode layer, an encapsulation layer, a curved touch detection and fingerprint detection layer, and a curved protective layer. The thin film transistor layer includes a plurality of thin film transistors, a plurality of scan lines, and a plurality of data lines. The plurality of scan lines is substantially perpendicular to the plurality of data lines. The pixel electrode layer includes a plurality of pixel electrodes.

The curved touch detection and fingerprint detection layer includes a plurality of sense electrodes and a plurality of traces for performing touch detection operation and fingerprint identification operation. A partial area of the curved touch detection and fingerprint detection layer and the curved protective layer exhibits a curved-surface shape.

Other objects, advantages, and novel features of the present disclosure will become more apparent from the following detailed description when taken in conjunction with the accompanying drawings.

DETAILED DESCRIPTION OF THE PREFERRED EMBODIMENT

The present disclosure will now be described in further detail with reference to the accompanying drawings and the accompanying embodiments, in which the objects, technologies and advantages of the present disclosure will become more clearly apparent. It is to be understood that the specific embodiments described herein are for illustrative purpose and are not intended to limit the disclosure.

Figure 1:
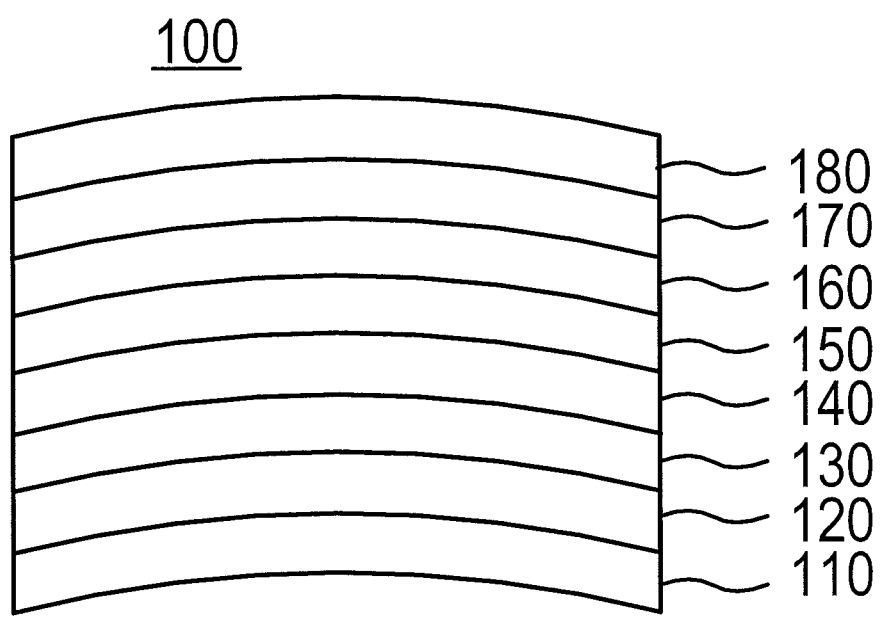
FIG. 1 is a schematic view of the curved-surface organic light emitting diode (OLED) display device with fingerprint identification in accordance with a first embodiment of the present disclosure.

The present disclosure relates to a curved-surface organic light emitting diode (OLED) display device with fingerprint identification. FIG. 1 is a schematic view of the curved-surface OLED display device 100 with fingerprint identification in accordance with the first embodiment of the present disclosure. As shown, the curved-surface OLED display device 100 includes a substrate 110, a thin film transistor layer 120, a pixel electrode layer 130, an organic light emitting material layer 140, a common electrode layer 150, an encapsulation layer 160, a curved touch detection and fingerprint detection layer 170, and a curved protective layer 180.

Figure 2:
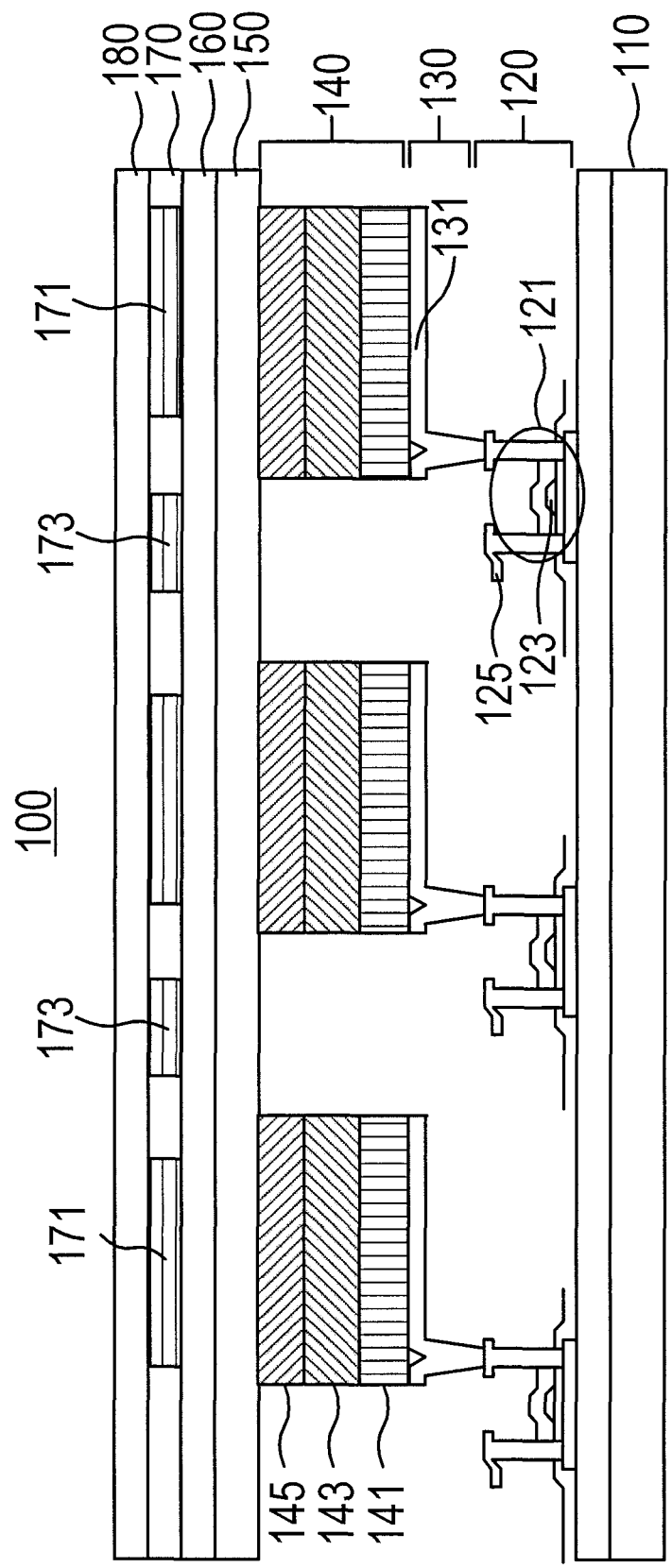
FIG. 2 is a stack diagram of the curved-surface OLED display device with fingerprint identification in accordance with the first embodiment of the present disclosure.

With reference to FIG. 1 as well as FIG. 2, the thin film transistor layer 120 includes a plurality of thin film transistors 121 (shown in FIG. 2), a plurality of scan lines 123 (shown in FIG. 2), and a plurality of data lines 125 (shown in FIG. 2). The pixel electrode layer 130 includes a plurality of pixel electrodes 131 (shown in FIG. 2). The curved touch detection and fingerprint detection layer 170 includes a plurality of sense electrodes 171 (shown in FIG. 2) and a plurality of traces 173 (shown in FIG. 2) for performing touch detection operation and fingerprint identification operation.

The curved protective layer 180 is arranged on one side of the curved touch detection and fingerprint detection layer 170, and can be a curved substrate, a flexible substrate or a polarizer.

As shown in FIG. 1, the substrate 110, the thin film transistor layer 120, the pixel electrode layer 130, the organic display material layer 140, the common electrode layer 150, the encapsulation layer 160, the curved touch detection and fingerprint detection layer 170, and the curved protective layer 180 exhibit a curved-surface shape. In another embodiment, a partial area of the curved touch detection and fingerprint detection layer 170 and the curved protective layer 180 exhibits a curved-surface shape.

FIG. 2 is a stack diagram of the curved-surface OLED display device 100 with fingerprint identification in accordance with the first embodiment of the present disclosure. As shown in FIG. 2, the thin film transistor layer 120 is disposed on one side of the substrate 110, and includes a plurality of thin film transistors 121, a plurality of scan lines 123, and a plurality of data lines 125. The scan lines 123 are drawn in the direction perpendicular to the drawing, and the data lines 125 are drawn in the direction parallel to the drawing. That is, the plurality of scan lines 123 is substantially perpendicular to the plurality of data lines 125.

In this embodiment, the TFT 121 is a bottom-gate structure. In other embodiments, the TFT 121 can be a top-gate structure. In this embodiment, the TFT 121 is an amorphous silicon (a-Si) transistor. In other embodiments, the TFT 121 can be a polysilicon transistor, for example, a low temperature polysilicon (LTPS) transistor.

The pixel electrode layer 130 includes a plurality of pixel electrodes 131 which are connected to the sources/drains of the thin film transistors 121, respectively.

The gate of the TFT 121 is connected to the scan line 123. The scan line 123 is able to control the on/off state of the TFT 121. The drain/source of TFT 121 is connected to the data line 125, and the source/drain of the TFT 121 is connected to the pixel electrode 131. When being in the on state, the TFT 121 is employed to transmit the display signal on the data line 125 to the pixel electrode 131 for performing the display operation.

The organic display material layer 140 includes a hole transporting layer 141, an emitting layer 143 and an electron transporting layer 145. The common electrode layer 150 is arranged on one side of the organic display material layer 140. The common electrode layer 150 can be made of the material, such as ITO, ZnO, IZO, GZO, conductive polymer, carbon nanotube, graphene, or silver film with a thickness less than 50 nanometers.

The light emitting principle of OLED is such that the electrons and electric holes are injected from the pixel electrodes 131 and the common electrode layer 150, respectively, by applying an electric field and, after the electric holes pass through the hole transporting layer 141 and electrons pass through the electron transporting layer 145, the electrons and electric holes enter the emitting layer 143 with fluorescent characteristics and then are combined with each other to produce excited photons, which immediately release energy and return to the ground state. The released energy will generate light of different colors based on different luminescent materials, so as to cause OLED to emit light.

The encapsulation layer 160 is arranged on one side of the common electrode layer 150 opposite to the organic display material layer 140. The curved touch detection and fingerprint detection layer 170 is arranged on one side of the encapsulation layer 160, and includes a plurality of sense electrodes 171 and a plurality of traces 173 for performing touch detection operation and fingerprint identification operation. The curved protective layer 180 is arranged on one side of the curved touch detection and fingerprint detection layer 170.

The curved touch detection and fingerprint detection layer 170 can be arranged on a transparent substrate (not shown) with the plurality of sense electrodes and the plurality of traces, and is further bonded to the curved protective layer 180.

Figure 3:
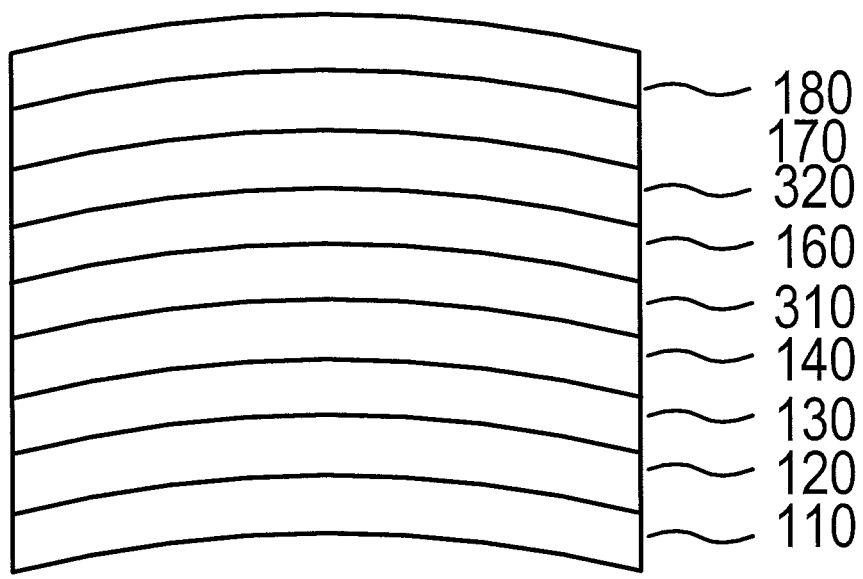
FIG. 3 is a schematic view of the curved-surface OLED display device with fingerprint identification in accordance with the second embodiment of the present disclosure.

FIG. 3 is a schematic view of the curved-surface OLED display device 100 with fingerprint identification in accordance with the second embodiment of the present disclosure. As shown, the curved-surface OLED display device 100 includes a substrate 110, a thin film transistor layer 120, a pixel electrode layer 130, an organic display material layer 140, a common electrode and force sense electrode layer 310, an encapsulation layer 160, a resilient dielectric material layer 320, a curved touch detection and fingerprint detection layer 170, and a curved protective layer 180. As shown, FIG. 3 is similar to FIG. 1 except that the common electrode layer 150 of FIG. 1 is replaced by the common electrode and force sense electrode layer 310 of FIG. 3, and the resilient dielectric material layer 320 of FIG. 3 is arranged between the encapsulation layer 160 and the curved touch detection and fingerprint detection layer 170.

That is, the curved touch detection and fingerprint detection layer 170 can be bonded to the encapsulation layer 160 with a flexible transparent adhesive material, and the common electrode layer 150 of FIG. 1 is replaced by the common electrode and force sense electrode layer 310 of FIG. 3, such that the original common electrode layer can be served as a force sense electrode layer.

Figure 4:
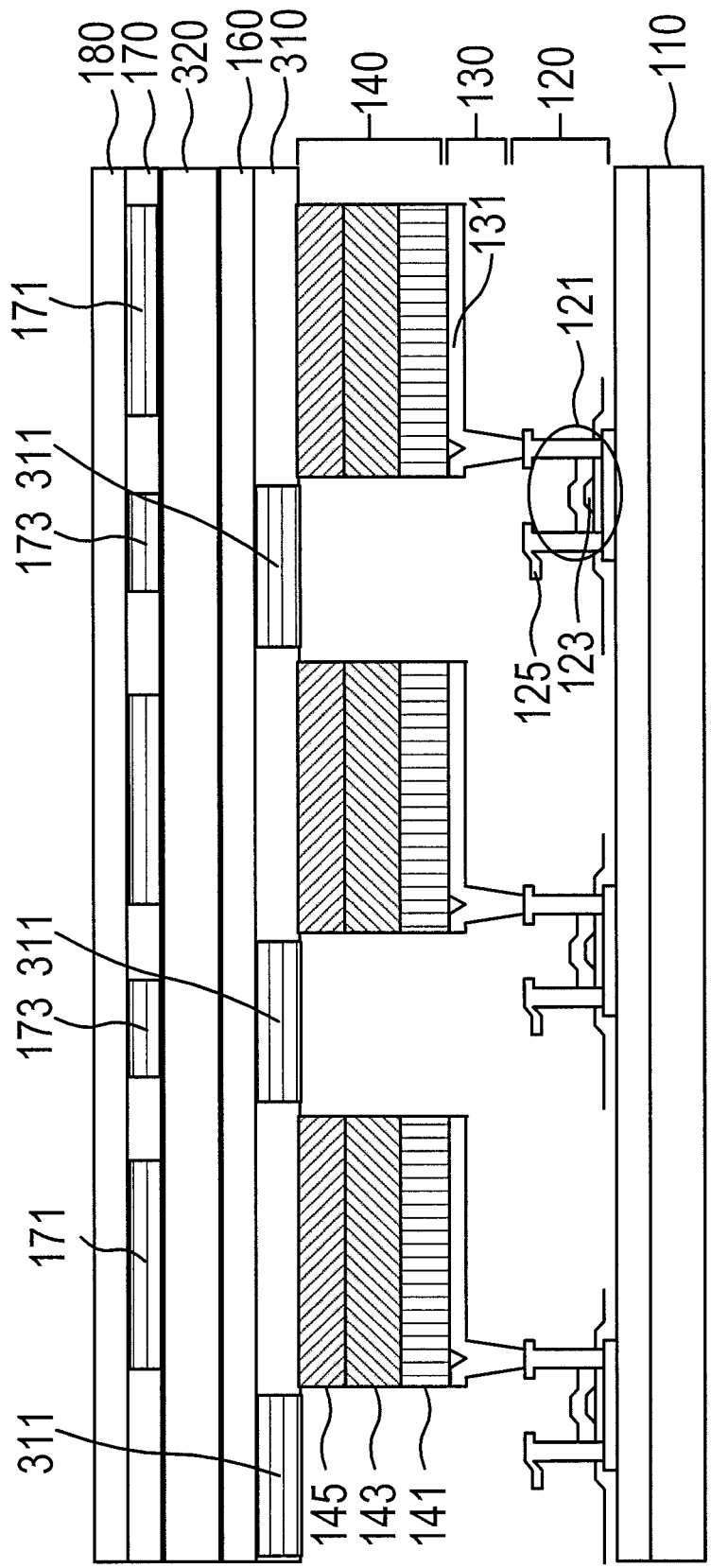
FIG. 4 is a stack diagram of the curved-surface OLED display device with fingerprint identification in accordance with the second embodiment of the present disclosure.

FIG. 4 is a stack diagram of the curved-surface OLED display device 100 with fingerprint identification in accordance with the second embodiment of the present disclosure. As shown, the common electrode and force sense electrode layer 310 has at least one force sense electrode 311 to perform force detection operation. In other embodiments, the entire common electrode and force sense electrode layer 310 has only one common electrode, and the common electrode also serves as a force electrode.

Figure 5:
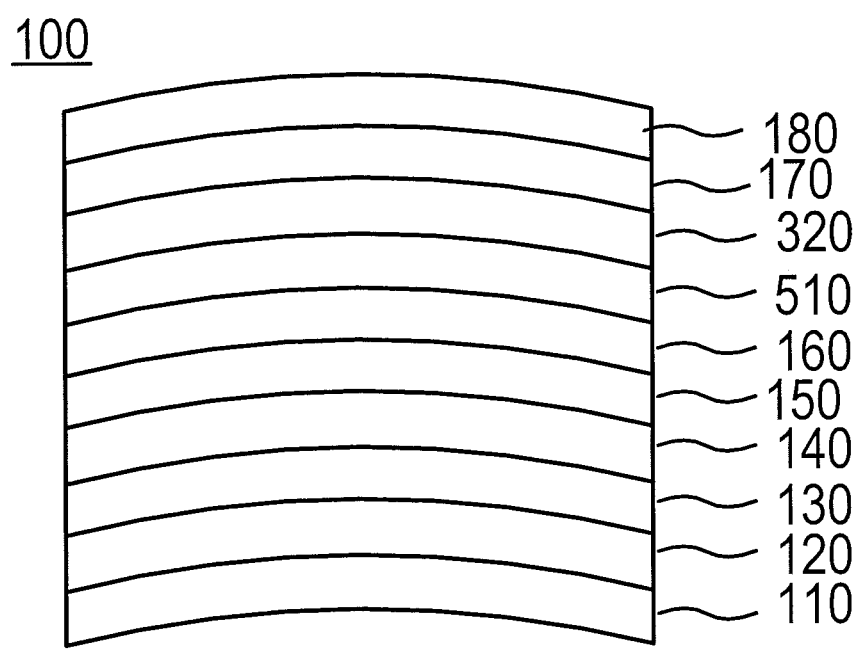
FIG. 5 is a schematic view of the curved-surface OLED display device with fingerprint identification in accordance with the third embodiment of the present disclosure.

FIG. 5 is a schematic view of the curved-surface OLED display device 100 with fingerprint identification in accordance with the third embodiment of the present disclosure. As shown, the curved-surface OLED display device 100 includes a substrate 110, a thin film transistor layer 120, a pixel electrode layer 130, an organic display material layer 140, a common electrode layer 150, an encapsulation layer 160, a force sense electrode layer 510, a resilient dielectric material layer 320, a curved touch detection and fingerprint detection layer 170, and a curved protective layer 180. As shown, FIG. 5 is similar to FIG. 3 except that the force sense electrode layer 510 is arranged between the encapsulation layer 160 and the resilient dielectric material layer 320.

The force sense electrode layer 510 is deployed on the encapsulation layer 160, and the curved touch detection and fingerprint detection layer 170 is arranged with the plurality of sense electrodes and the plurality of traces, and is further bonded to the force sense electrode layer by the resilient dielectric material layer 320. The material of the resilient dielectric material layer 320 can be the optical glue, spacer, transparent bubble layer, and so on.

Figure 6:
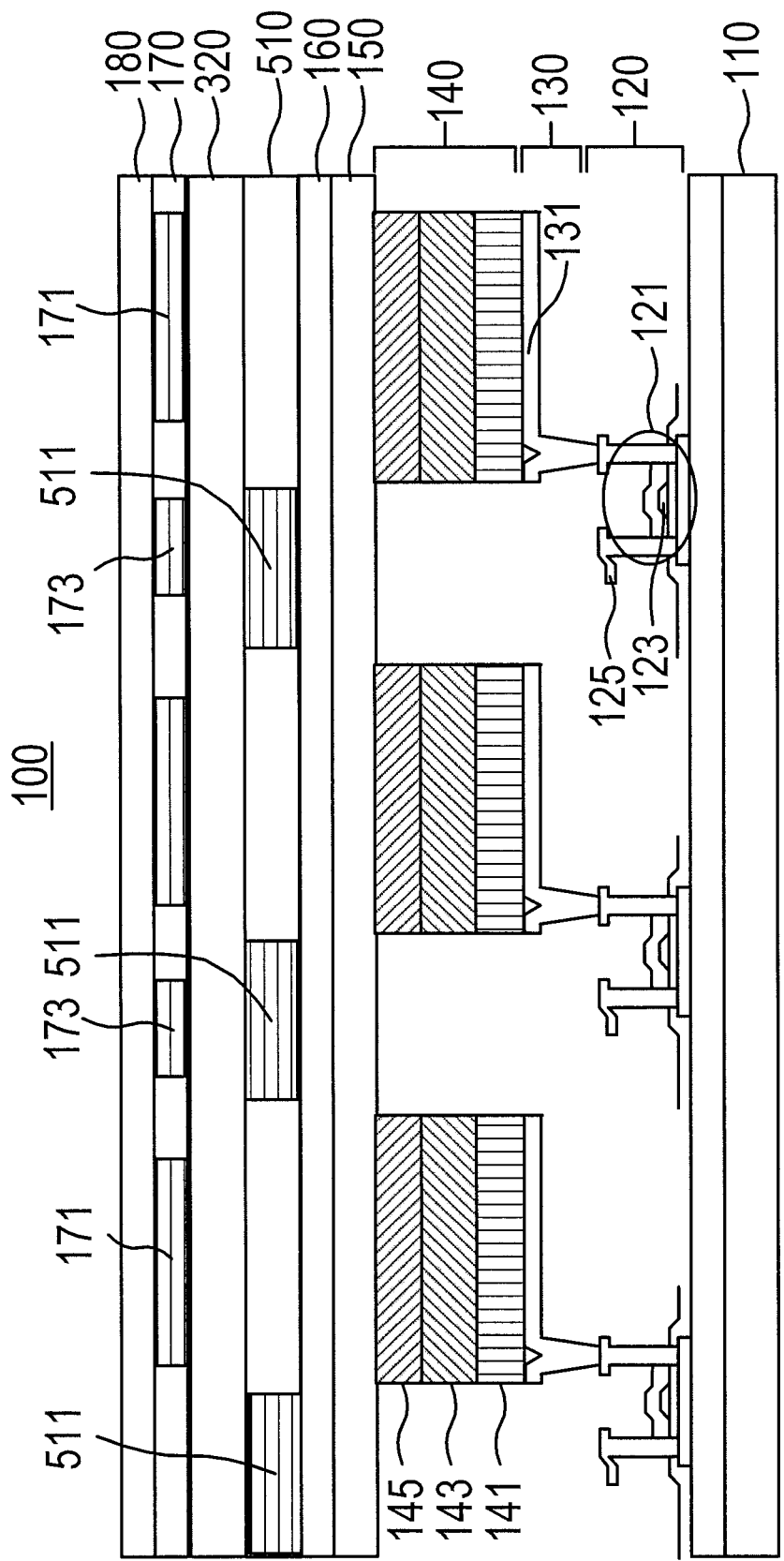
FIG. 6 is a stack diagram of the curved-surface OLED display device with fingerprint identification in accordance with the third embodiment of the present disclosure.

FIG. 6 is a stack diagram of the curved-surface OLED display device 100 with fingerprint identification in accordance with the third embodiment of the present disclosure. The force sense electrode layer 510 has at least one force sense electrode 511 to perform a force detection operation. The force sense electrodes 311, 511 are made of the material, such as ITO, ZnO, IZO, GZO, conductive polymer, carbon nanotube, graphene, or silver film with a thickness less than 50 nanometers. In other preferred embodiments, the entire force electrode layer 510 is a transparent conductive force electrode.

Figure 7:
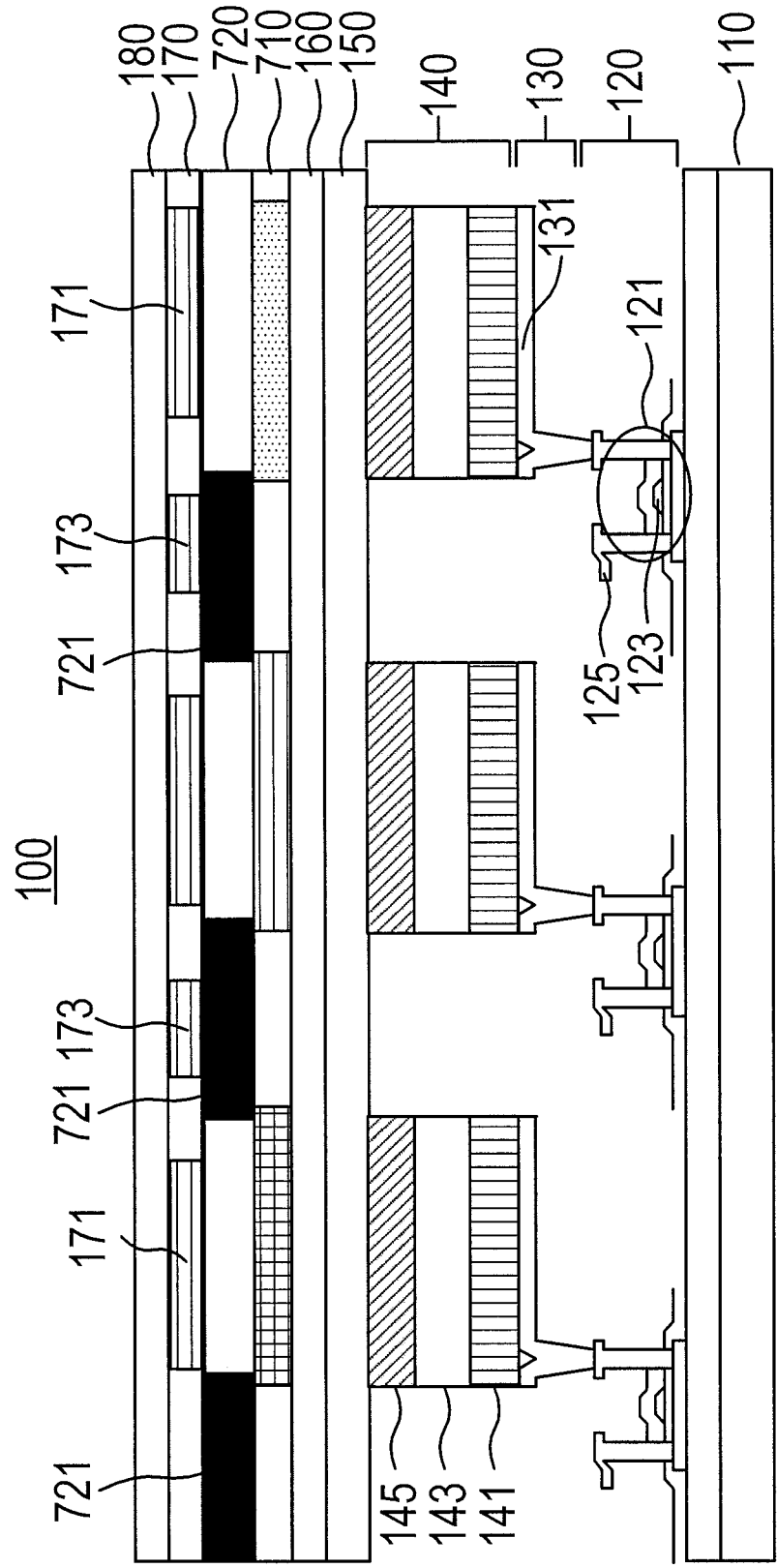
FIG. 7 is another stack diagram of the curved-surface OLED display device with fingerprint identification in accordance with the present disclosure.

FIG. 7 is another stack diagram of the curved-surface OLED display device 100 with fingerprint identification in accordance with the present disclosure. As shown, in comparison with FIG. 2, the curved-surface OLED display device 100 of FIG. 7 further includes a color filter layer 710 and a black matrix layer 720. The black matrix layer 720 is disposed at one side of the curved touch detection and fingerprint detection layer 170 that faces the organic display material layer 140, and the black matrix layer 720 is composed of a plurality of opaque conductor lines 721.

The color filter layer 710 is disposed among the plurality of opaque conductor lines 721 of the black matrix layer 720 and on the surface of the plurality of opaque conductor lines 721. In this embodiment, the organic display material layer 140 is preferred to emit white light, and uses the color filter layer 710 to filter out and generate red, blue and green primary colors.

Figure 8:
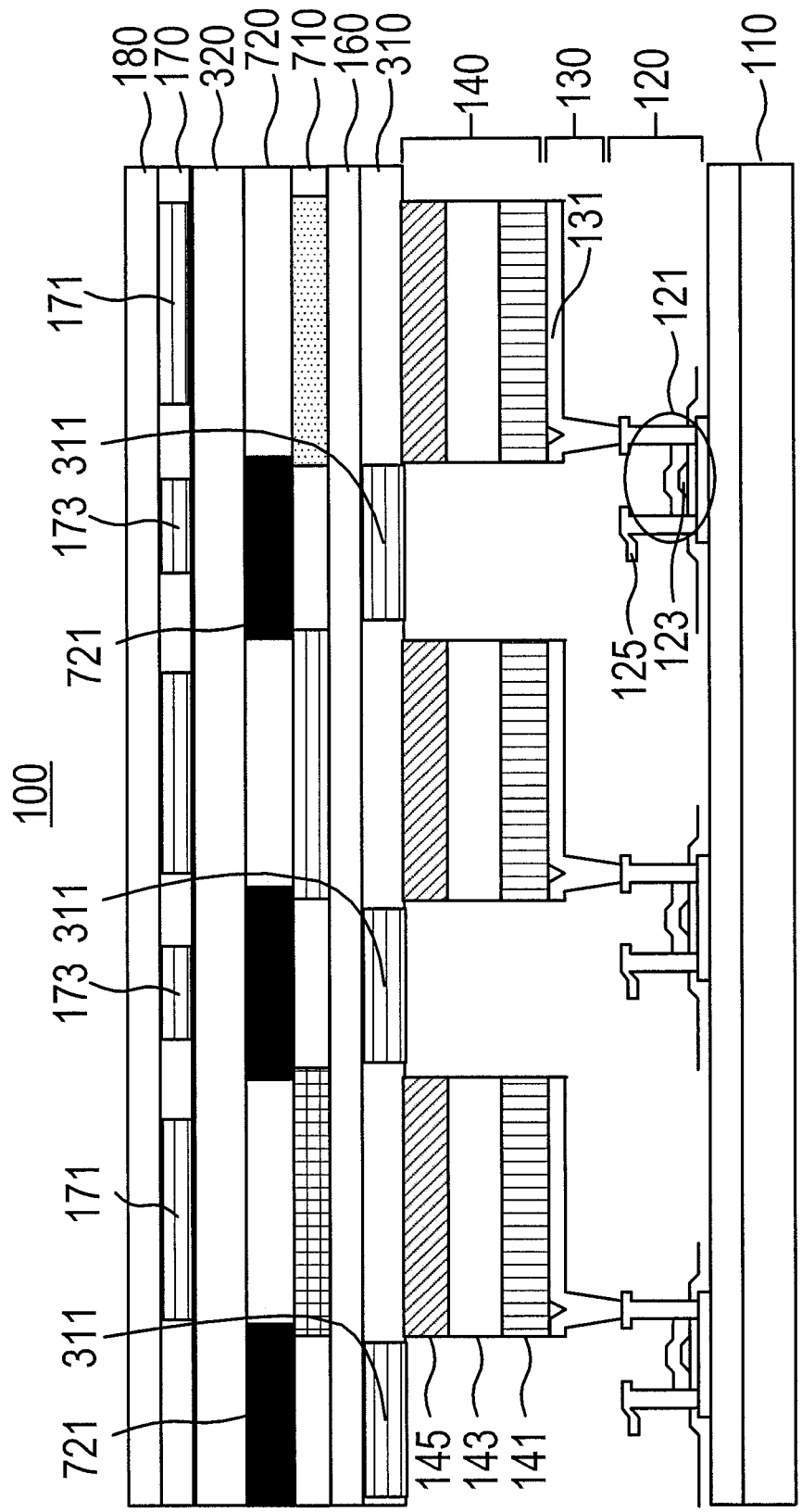
FIG. 8 is still another stack diagram of the curved-surface OLED display device with fingerprint identification in accordance with the present disclosure.

FIG. 8 is still another stack diagram of the curved-surface OLED display device 100 with fingerprint identification in accordance with the present disclosure. As shown, in comparison with FIG. 4, the curved-surface OLED display device 100 of FIG. 8 further includes a color filter layer 710 and a black matrix layer 720. The black matrix layer 720 is disposed at one side of the resilient dielectric material layer 320 that faces the organic display material layer 140, and the black matrix layer 720 is composed of a plurality of opaque conductor lines 721.

The color filter layer 710 is disposed among the plurality of opaque conductor lines 721 of the black matrix layer 720 and on the surface of the plurality of opaque conductor lines 721. In this embodiment, the organic display material layer 140 is preferred to emit white light, and uses the color filter layer 710 to filter out and generate red, blue and green primary colors.

Figure 9:
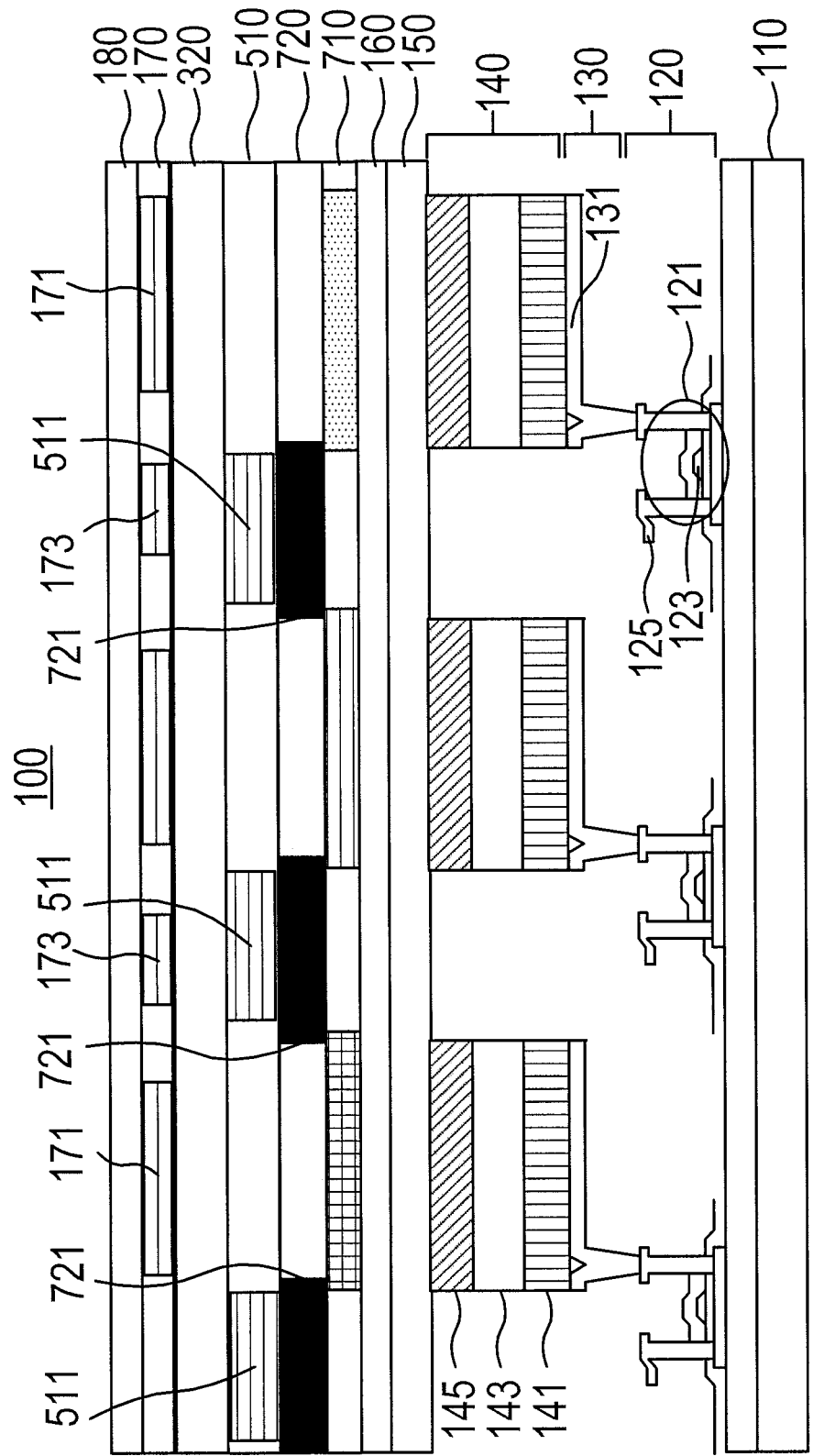
FIG. 9 is further another stack diagram of the curved-surface OLED display device with fingerprint identification in accordance with the present disclosure.

FIG. 9 is further another stack diagram of the curved-surface OLED display device 100 with fingerprint identification in accordance with the present disclosure. As shown, in comparison with FIG. 6, the curved-surface OLED display device 100 of FIG. 9 further includes a color filter layer 710 and a black matrix layer 720. The black matrix layer 720 is disposed on one side of the force sense electrode layer 510 that faces the organic display material layer 140, and the black matrix layer 720 is composed of a plurality of opaque conductor lines 721.

The color filter layer 710 is disposed among the plurality of opaque conductor lines 721 of the black matrix layer 720 and on the surface of the plurality of opaque conductor lines 721. In this embodiment, the organic display material layer 140 is preferred to emit white light, and uses the color filter layer 710 to filter out and generate red, blue and green primary colors.

Figure 10:
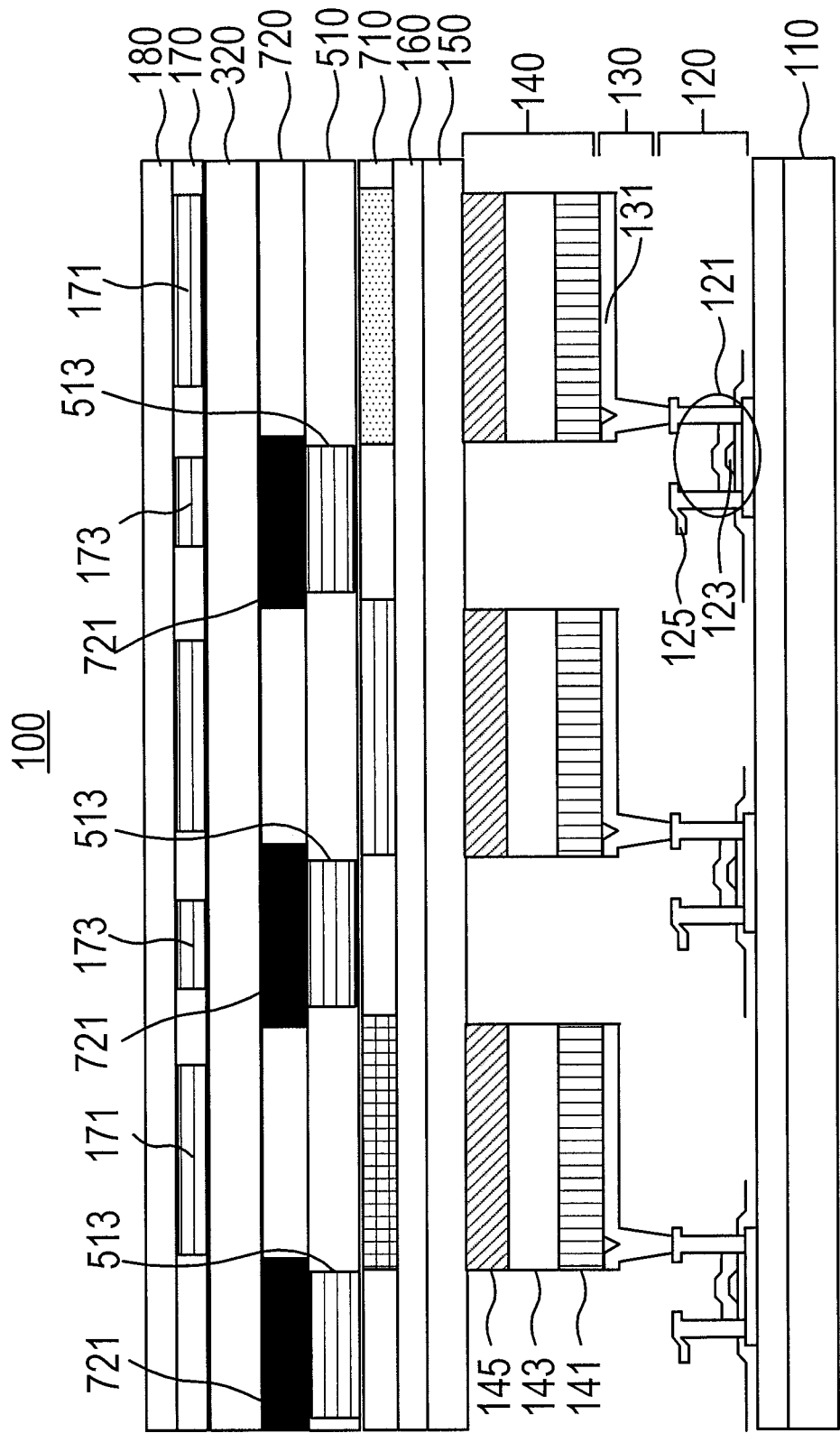
FIG. 10 is yet another stack diagram of the curved-surface OLED display device with fingerprint identification in accordance with the present disclosure.

FIG. 10 is yet another stack diagram of a curved-surface OLED display device 100 with fingerprint identification in accordance with the present disclosure. As shown, in comparison with FIG. 9, the black matrix layer 720 of FIG. 10 is disposed between the resilient dielectric material layer 320 and the force sense electrode layer 510, and the force sense electrode layer 510 of FIG. 10 is disposed between the black matrix layer 720 and the color filter layer 710.

Figure 11:
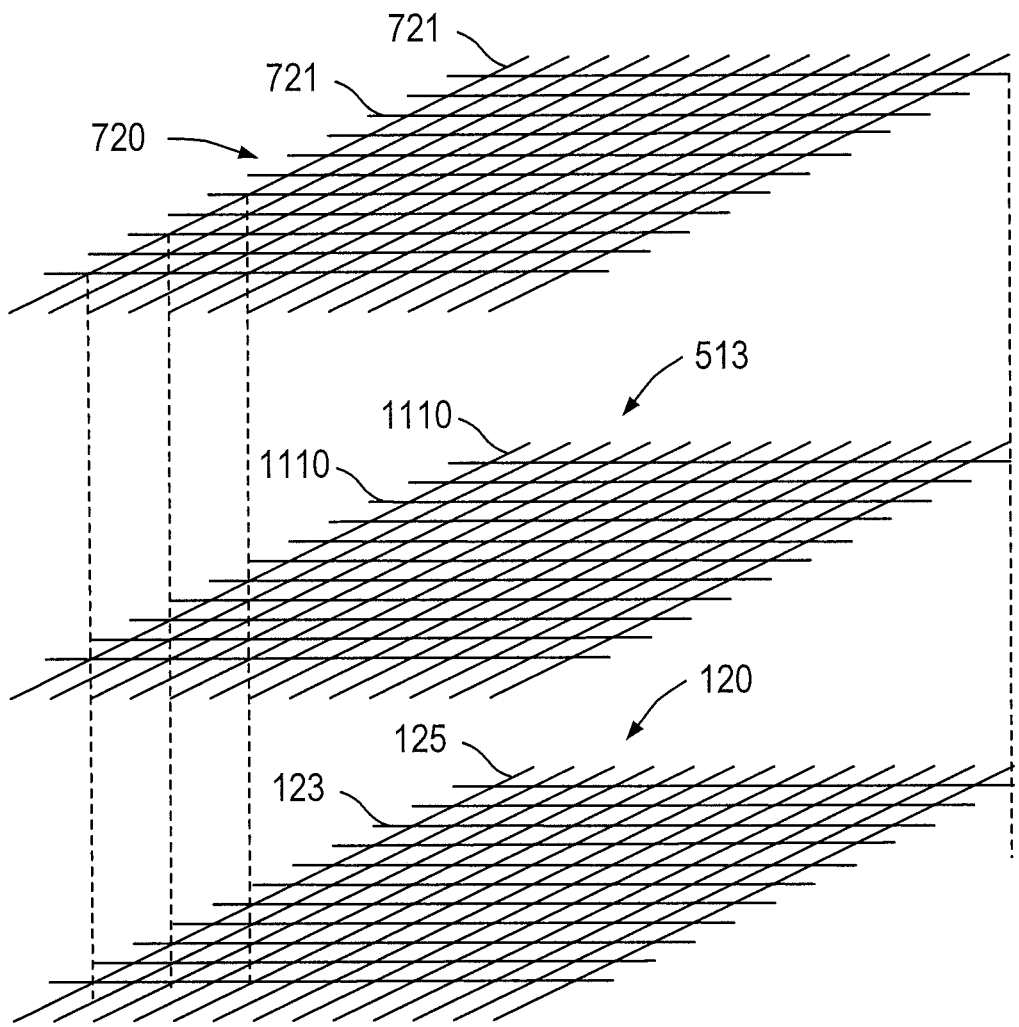
FIG. 11 is a schematic diagram illustrating the black matrix layer, the thin film transistor layer and the force sense electrode of the curved-surface OLED display device in accordance with the present disclosure.

FIG. 11 is a schematic diagram illustrating the black matrix layer 720, the thin film transistor layer 120 and the force sense electrode 513 of the curved-surface organic light emitting diode display device 100 in accordance with the present disclosure. As shown, the black matrix layer 720 is composed of a plurality of opaque lines 721 with insulating material that are black and opaque. The opaque lines 721 of black insulating material are arranged as a checkerboard pattern. The locations of the opaque lines 721 of black insulating material are corresponding to the locations of the scan lines 123 and data lines 125 in the thin film transistor layer 120. Thus, in viewing the touch display panel, a user will not sense the existence of the scan lines 123 and data lines 125.

The force sense electrode layer 510 includes at least one mesh-like force sense electrode 513. The at least one mesh-like force sense electrode 513 is a metal mesh electrode formed by mesh lines 1110, and the mesh lines 1110 of the at least one mesh-like force sense electrode 513 are disposed at locations corresponding to opaque lines 721 of the black matrix layer 720.

The mesh line 1110 is formed of conductive metal material which is selected from the group consisting of chromium, barium, aluminum, silver, copper, titanium, nickel, tantalum, cobalt, tungsten, magnesium, calcium, potassium, lithium, indium, and an alloy thereof.

Figure 12:
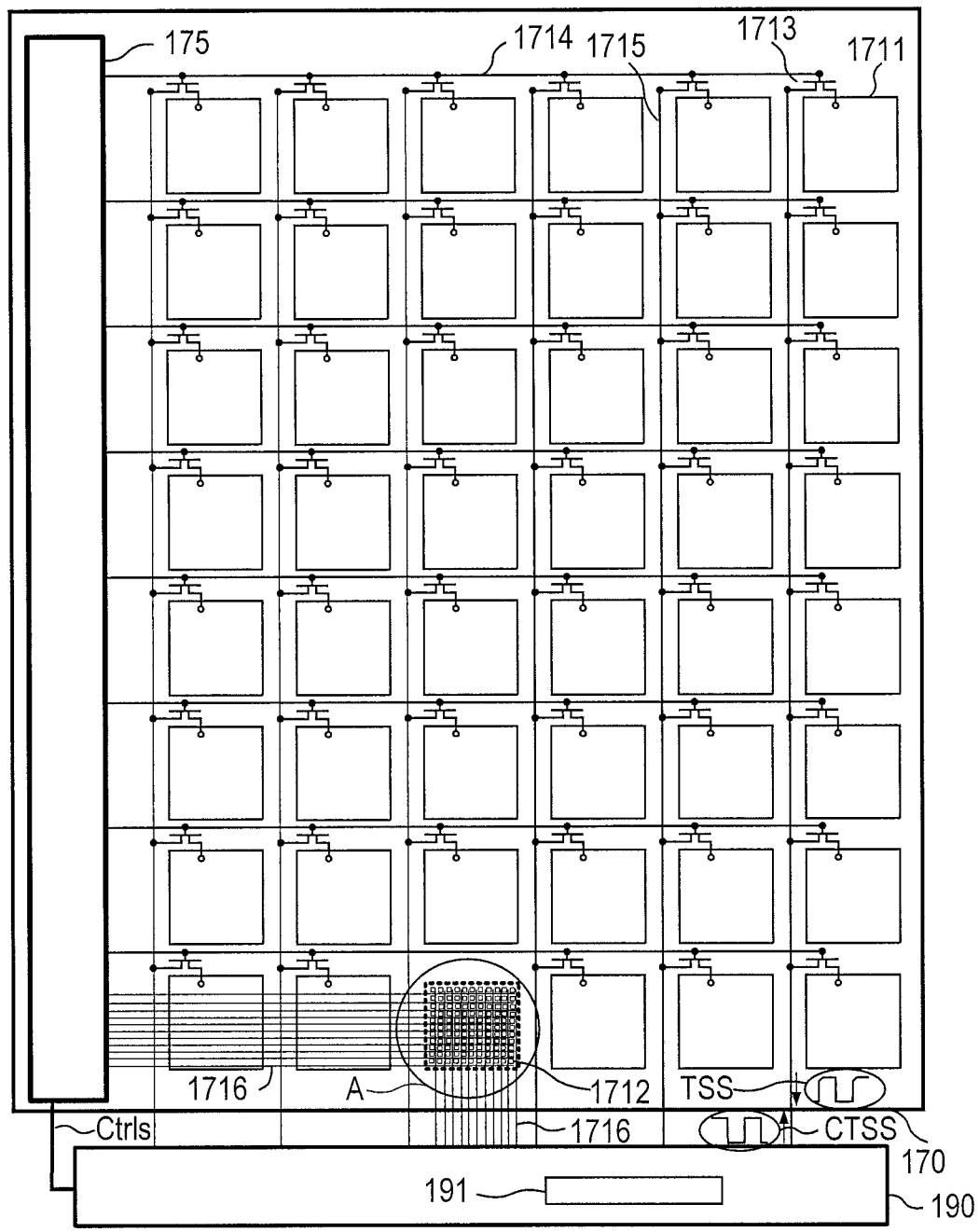
FIG. 12 is a schematic diagram illustrating a curved touch detection and fingerprint detection layer in accordance with the present disclosure.

FIG. 12 is a schematic diagram illustrating a curved touch detection and fingerprint detection layer 170 in accordance with the present disclosure. As shown, the curved-surface OLED display device 100 of FIG. 12 further includes a touch detection and fingerprint identification circuit 190. The touch detection and fingerprint identification circuit 190 includes a self-capacitance detection circuit 191 to perform a self-capacitance detection for the force sense, touch detection and fingerprint identification.

The plurality of sense electrodes 171 in the curved touch detection and fingerprint detection layer 170 can be divided into touch sense electrodes 1711 and fingerprint identification electrodes 1712. The size of the touch sense electrode

1711 is in the order of millimeter (mm), and the size of the fingerprint identification electrode 1712 is in the order of micrometer (μm).

As shown, the fingerprint sense electrodes 1712 are arranged in one side of the curved touch detection and fingerprint detection layer 170. In this embodiment, the fingerprint sense electrodes 1712 can be arranged in the side near the touch detection and fingerprint identification circuit 190.

The curved touch detection and fingerprint detection layer 170 further includes a first TFT shift register device 175, a plurality of thin film transistors 1713, a plurality of touch gate lines 1714, a plurality of touch data lines 1715, and a plurality of fingerprint lines 1716.

Each of touch gate lines 1714 is electrically connected to the gates of a plurality of the thin film transistors 1713 corresponding to the touch sense electrodes 1711.

Each of the touch data lines 1715 is electrically connected to sources or drains of the thin film transistors 1713 corresponding to the touch sense electrodes 1711.

The first TFT shift register device 175 is connected to the plurality of touch gate lines 1714 and the plurality of fingerprint lines 1716. The touch detection and fingerprint identification circuit 190 is connected to the plurality of touch data lines 1715 and the plurality of fingerprint lines 1716.

In touch sensing, the touch detection and fingerprint identification circuit 190 can provide the control signals Ctrls to the first TFT shift register device 175, and then the first TFT shift register device 175 sequentially outputs the touch turn-on signals to the thin film transistors 1713. At the same time, the touch detection and fingerprint identification circuit 190 outputs a capacitive touch stimulating signal (CTSS) to the touch data lines 1715. Then, the touch detection and fingerprint identification circuit 190 reads a touch sense signal (TSS) from the touch data lines 1715 and sends the touch sense signal to the self-capacitance detection circuit 191 for detecting whether there is an external object approaching touch sense electrode 1711.

Figure 13:
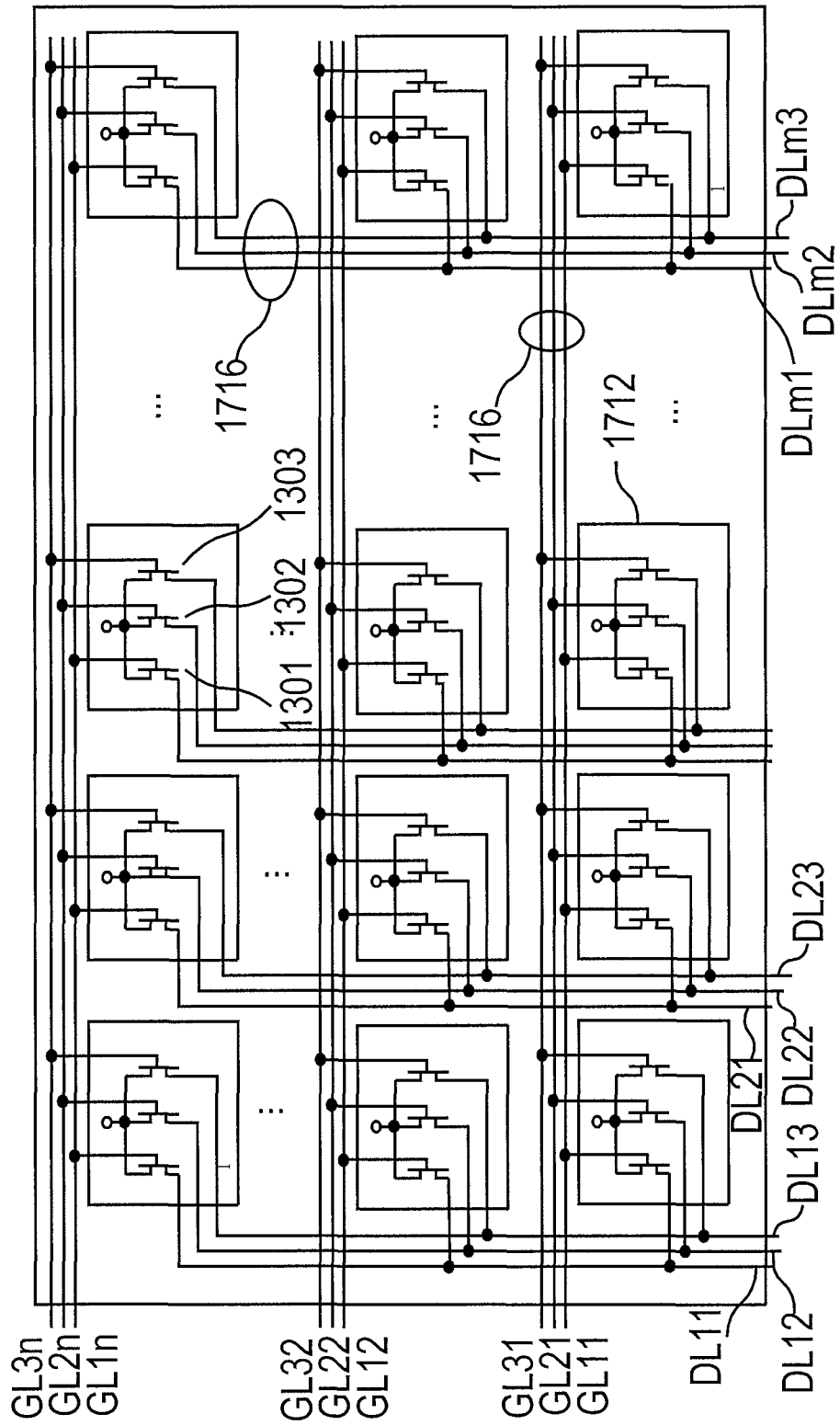
FIG. 13 is a schematic diagram illustrating fingerprint sense electrodes in accordance with the present disclosure.

FIG. 13 is a schematic diagram illustrating fingerprint sense electrodes 1712 in accordance with the present disclosure. FIG. 13 is an enlarged view of the circle "A" depicted in FIG. 12. As shown, there are n-rows and m-columns of fingerprint sense electrodes 1712 arranged in a matrix form. Each of the fingerprint sense electrodes 1712 is connected to drains/sources of three thin film transistors 1301, 1302, 1303 which are deployed in the curved touch detection and fingerprint detection layer 170. In another embodiment, three thin film transistors 1301, 1302 and 1303 can be deployed in the thin film transistor layer 120 and connected to the corresponding fingerprint sense electrodes 1712 by vias (not shown).

The plurality of fingerprint lines 1716 can be divided into a plurality of gate lines GL11, GL21, GL31, . . . , GL3n and a plurality of data lines DL11, DL12, DL13, . . . , GLm3. The data line DL11 is electrically connected to the sources or drains of a plurality of the thin film transistors 1301 corresponding to the fingerprint sense electrodes 1712 of the first column, the data line DL12 is electrically connected to the sources or drains of a plurality of the thin film transistors 1302 corresponding to the fingerprint sense electrodes 1712 of the first column, the data line DL13 is electrically connected to the sources or drains of a plurality of the thin film transistors 1303 corresponding to the fingerprint sense electrodes 1712 of the first column, the data line DL21 is electrically connected to the sources or drains of a plurality of the thin film transistors 1301 corresponding to the fingerprint sense electrodes 1712 of the second column, and so on.

The gate line GL11 is electrically connected to the gates of a plurality of the thin film transistors 1301 corresponding to the fingerprint sense electrodes 1712 of the first row, the gate line GL21 is electrically connected to the gates of a plurality of the thin film transistors 1302 corresponding to the fingerprint sense electrodes 1712 of the first row, the gate line GL31 is electrically connected to the gates of a plurality of the thin film transistors 1303 corresponding to the fingerprint sense electrodes 1712 of the first row, the gate line GL12 is electrically connected to the gates of a plurality of the thin film transistors 1301 corresponding to the fingerprint sense electrodes 1712 of the second row, and so on.

The touch detection and fingerprint identification circuit 190 outputs a capacitive stimulating signal (CSS) to the plural data lines DL11, DL21, . . . , DLm1, outputs a convergence stabilization signal (CoSS) to the plural data lines DL12, DL22, . . . , DLm2, and outputs a reflection masking signal (RMS) to the plural data lines DL13, DL23, . . . , DLm3. Thus, by controlling the gate lines GL11, GL21, GL31, . . . , GL3n, the fingerprint sense electrodes 1712 may be provided with a capacitive stimulating signal, a reflection masking signal (RMS), or a convergence stabilization signal (CoSS).

Figure 14:
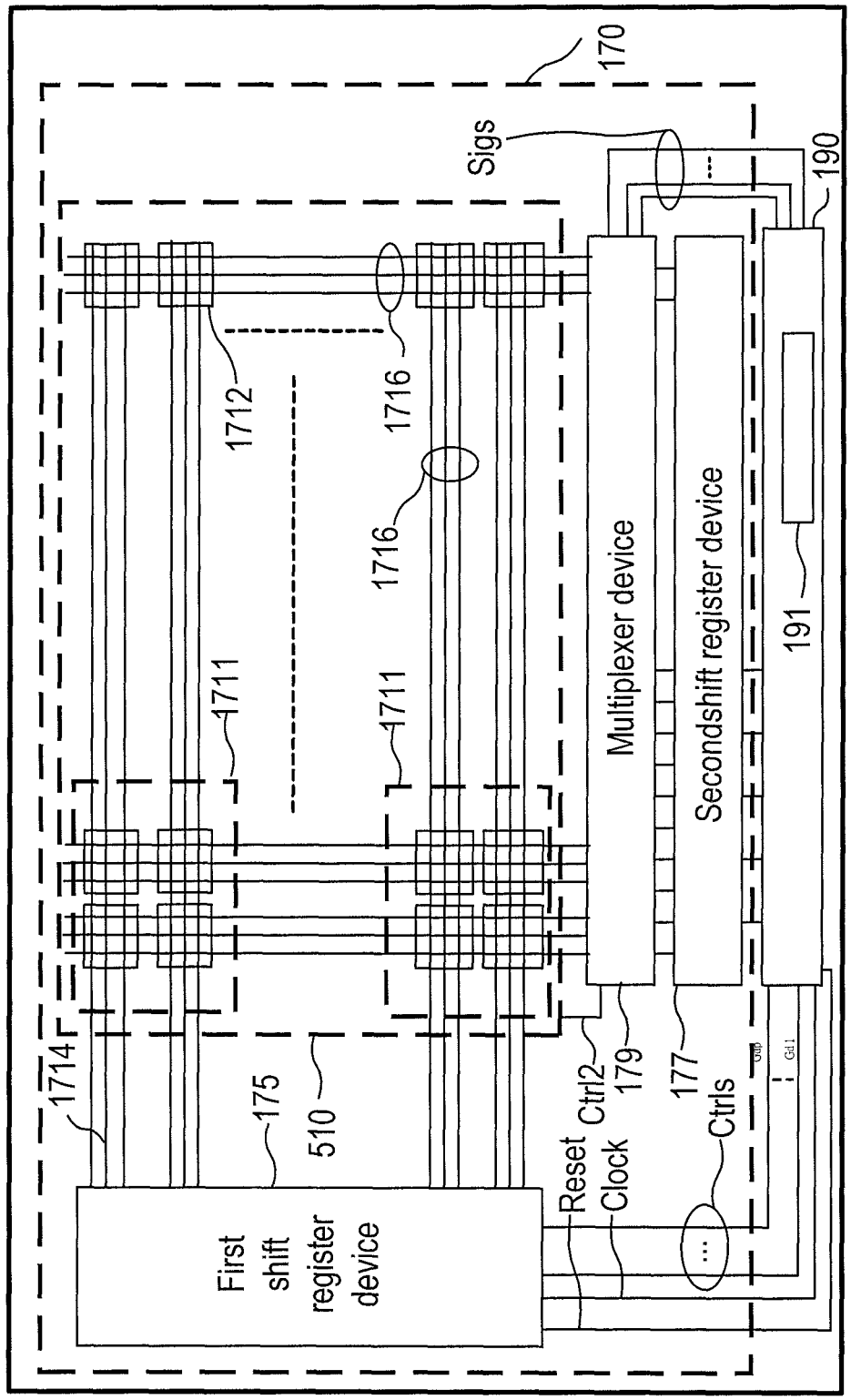
FIG. 14 is a schematic diagram illustrating a force sense electrode layer, a curved touch detection and fingerprint detection layer, and a touch detection and fingerprint identification circuit in accordance with the present disclosure.

FIG. 14 is a schematic diagram illustrating a force sense electrode layer 510, a curved touch detection and fingerprint detection layer 170, and a touch detection and fingerprint identification circuit 190 in accordance with the present disclosure. As shown, the curved touch detection and fingerprint detection layer 170 further includes a second TFT shift register device 177 and a multiplexer device 179.

The force sense electrode layer 510 includes at least one mesh-like force sense electrode 513. For the purpose of clarity, in FIG. 14, it does not depict the at least one mesh-like force sense electrode 513 or an entire plate transparent force sense electrode 513. Moreover, the size of the curved touch detection and fingerprint detection layer 170 and force sense electrode layer 510 is approximated to the size of the curved-surface OLED display device 100. The size of the curved touch detection and fingerprint detection layer 170 and force sense electrode layer 510 in FIG. 14 is just provided for illustrating purpose.

In FIG. 14, the curved touch detection and fingerprint detection layer 170 includes a plurality of fingerprint identification electrodes 1712 with the size of micrometer (μm) order. A plurality of the fingerprint identification electrodes 1712 can be configured to form the touch sense electrodes 1711.

The touch detection and fingerprint identification circuit 190 is electrically connected to the multiplexer device 179 by a signal bus (Sigs). The signal bus (Sigs) includes the capacitive touch stimulating signal (CTSS), the touch sense signal (TSS), the capacitive stimulating signal (CSS), the convergence the stabilization signal (CoSS), the reflection masking signal (RMS) and so on.

The first TFT shift register device 175 outputs the control signals to the gate lines 1714 to turn on/off the corresponding thin film transistors 1301, 1302, 1303. The second TFT shift register device 177 outputs the control signals to the multiplexer device 179 to turn on/off the corresponding thin film transistors switches. Based on the control signals outputted by the second TFT shift register device 177 and the signals of the signal bus (Sigs), the multiplexer device 179 can configure the plurality of fingerprint identification electrodes 1712 to form the touch sense electrodes 1711. The person skilled in the art can implement the aforementioned functions according to the descriptions of the present disclosure, and thus a detailed description therefor is deemed unnecessary.

Figure 15:
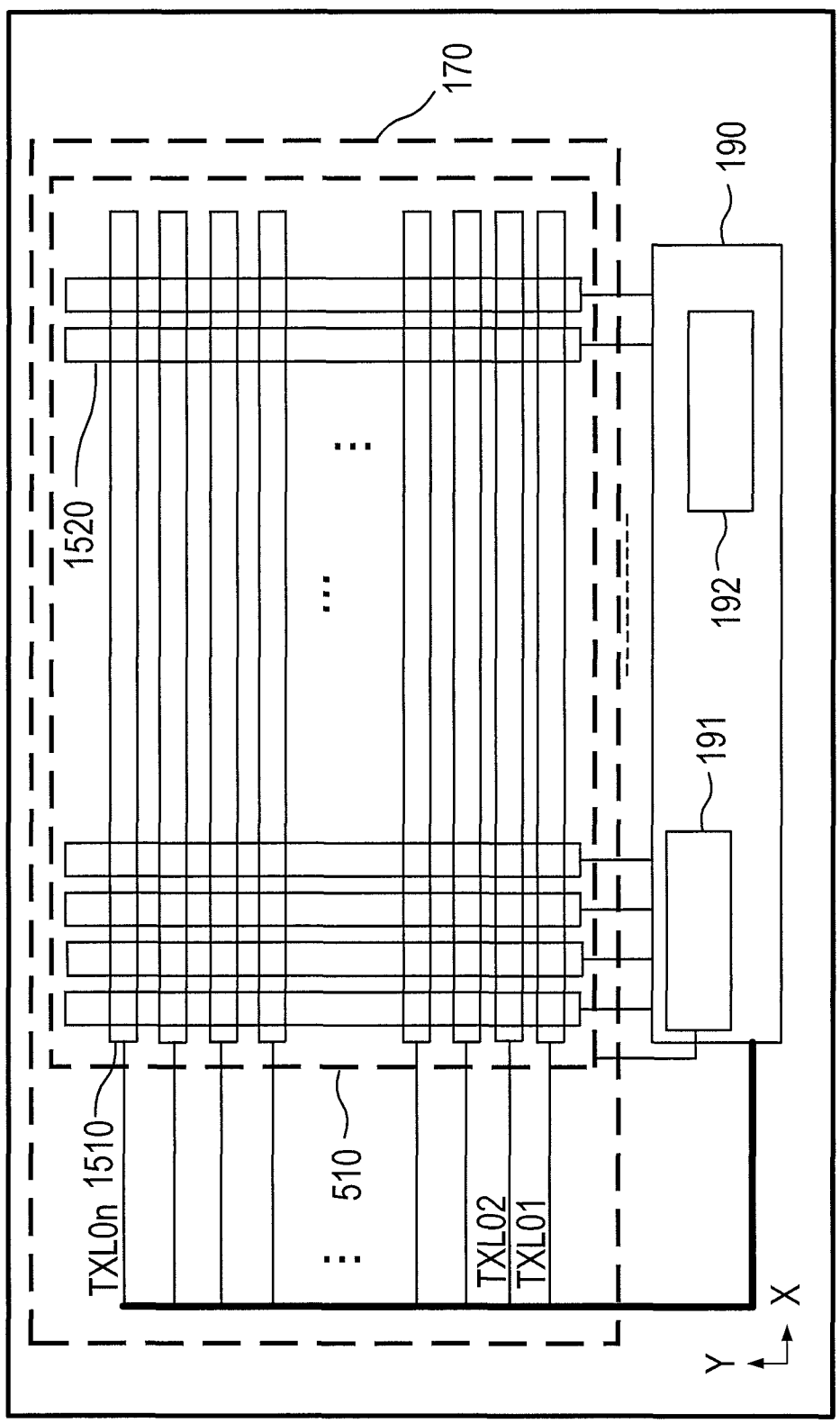
FIG. 15 is a schematic diagram illustrating a force sense electrode layer, a curved touch detection and fingerprint detection layer, and a touch detection and fingerprint identification circuit in accordance with the present disclosure.

FIG. 15 is a schematic diagram illustrating a force sense electrode layer 510, a curved touch detection and fingerprint detection layer 170, and a touch detection and fingerprint identification circuit 190 in accordance with the present disclosure. As shown, the touch detection and fingerprint identification circuit 190 further includes a mutual-capacitance detection circuit 192 to perform mutual-capacitance detection. The force sense electrode layer 510 includes at least one force sense electrode 513. For the purpose of clarity, in FIG. 15, it does not depict the at least one mesh-like force sense electrode 513 or an entire plate transparent force sense electrode 513.

In FIG. 15, the curved touch detection and fingerprint detection layer 170 includes a plurality of touch sense electrodes 1711 and a plurality of fingerprint identification electrodes 1712 with the size of micrometer (μm) order. For the purpose of clarity, in FIG. 15, it does not depict the plurality of fingerprint identification electrodes 1712. In FIG. 15, the plurality of touch sense electrodes 1711 is divided into a plurality of transmitting touch electrodes 1510 and a plurality of receiving touch electrodes 1520. The plurality of transmitting touch electrodes 1510 are arranged along a first direction (X-axis direction), and the plurality of receiving touch electrodes 1520 are arranged along a second direction (Y-axis direction) for performing a mutual-capacitance touch detection.

The touch detection and fingerprint identification circuit 190 can sequentially or simultaneously transmit a touch stimulating signal (TSS) TXL01, TXL02, TXL03, . . . , TXL0n to the plurality of transmit touch electrodes 1510, and reads a touch sense signal (TSS) from the plurality of receive touch electrodes 1520 and sends the touch sense signal (TSS) to the mutual-capacitance detection circuit 192 to perform a mutual-capacitance touch detection.

The self-capacitance detection circuit 191 is used to perform the self-capacitance detection for the force sense and fingerprint identification. The person skilled in the art can implement the force sense and fingerprint identification according to the descriptions of the present disclosure, and thus a detailed description therefor is deemed unnecessary.

In view of the foregoing, the present disclosure provides a curved-surface OLED display device 100 with fingerprint identification in which the corresponding transistors are thin film transistors and integrated in the curved touch detection and fingerprint detection layer 170, such that the touch elements and fingerprint identification elements can be embedded and integrated into the display device. Therefore, the size of the curved-surface OLED display device 100 can be dramatically reduced and the manufacturing process can be simplified.

Although the present invention has been explained in relation to its preferred embodiment, it is to be understood that many other possible modifications and variations can be made without departing from the spirit and scope of the invention as hereinafter claimed.

What is claimed is:

1. A curved-surface organic light emitting diode display device with fingerprint identification, comprising:
   a substrate;
   a thin film transistor layer including a plurality of thin film transistors, a plurality of scan lines, and a plurality of data lines, the plurality of scan lines being substantially perpendicular to the plurality of data lines;
   a pixel electrode layer including a plurality of pixel electrodes;
   an organic display material layer,
   a common electrode layer;
   an encapsulation layer;
   a curved touch detection and fingerprint detection layer including a plurality of sense electrodes and a plurality of traces for performing touch detection operation and fingerprint identification operation;
   a curved protective layer; and
   a touch detection and fingerprint identification circuit configured to output a capacitive stimulating signal, a convergence stabilization signal, or a reflection masking signal to the plural data lines, and the capacitive stimulating signal, the convergence stabilization signal, or the reflection masking signal being provided to the fingerprint sense electrodes by controlling the gate lines;
   wherein a partial area of the curved touch detection and fingerprint detection layer and the curved protective layer exhibits a curved-surface shape;
   wherein the thin film transistor layer is disposed on the substrate, the pixel electrode layer is disposed on the thin film transistor layer, the organic display material layer is disposed on the pixel electrode layer, the common electrode layer is disposed on the organic display material layer, the encapsulation layer is disposed on the common electrode layer, the curved touch detection and fingerprint detection layer is disposed on the encapsulation layer and the curved protective layer is disposed on the curved touch detection and fingerprint detection layer.

2. The curved-surface organic light emitting diode display device with fingerprint identification as claimed in claim 1, further comprising a resilient dielectric material layer and a force sense electrode layer, the force sense electrode layer having at least one force sense electrode.

3. The curved-surface organic light emitting diode display device with fingerprint identification as claimed in claim 1, further comprising a resilient dielectric material layer, the common electrode layer serving as a force sense electrode layer.

4. The curved-surface organic light emitting diode display device with fingerprint identification as claimed in claim 1, wherein the curved protective layer is a curved substrate, a flexible substrate or a polarizer.

5. The curved-surface organic light emitting diode display device with fingerprint identification as claimed in claim 1, wherein the curved touch detection and fingerprint detection layer is arranged on a transparent substrate with the plurality of sense electrodes and the plurality of traces, and is further bonded to the curved protective layer.

6. The curved-surface organic light emitting diode display device with fingerprint identification as claimed in claim 5, wherein the curved touch detection and fingerprint detection layer is bonded to the encapsulation layer with a flexible transparent adhesive material, and the common electrode layer serves as a force sense electrode layer.

7. The curved-surface organic light emitting diode display device with fingerprint identification as claimed in claim 4, wherein a force sense electrode layer is deployed on the encapsulation layer, and the curved touch detection and fingerprint detection layer is arranged with the plurality of sense electrodes and the plurality of traces, and is further bonded to the force sense electrode layer.

8. The curved-surface organic light emitting diode display device with fingerprint identification as claimed in claim 4, wherein the curved touch detection and fingerprint detection layer is arranged with the plurality of sense electrodes, the plurality of traces, and the plurality of thin film transistors, and is further bonded to the encapsulation layer with a flexible transparent adhesive material.

9. The curved-surface organic light emitting diode display device with fingerprint identification as claimed in claim 4, wherein a force sense electrode layer is deployed on the encapsulation layer, and the curved touch detection and fingerprint detection layer is arranged with the plurality of sense electrodes, the plurality of traces and the plurality of thin film transistors, and is further bonded to the force sense electrode layer.

10. The curved-surface organic light emitting diode display device with fingerprint identification as claimed in claim 1, wherein the touch detection and fingerprint identification circuit has a self-capacitance detection circuit.

11. The curved-surface organic light emitting diode display device with fingerprint identification as claimed in claim 1, wherein the touch detection and fingerprint identification circuit has a mutual-capacitance detection circuit.

\* \* \* \* \*